(12) United States Patent
Kreupl

(10) Patent No.: US 7,728,405 B2
(45) Date of Patent: Jun. 1, 2010

(54) CARBON MEMORY

(75) Inventor: Franz Kreupl, Munich (DE)

(73) Assignee: Qimonda AG, Munich (DE)

( * ) Notice: Subject to any disclaimer, the term of this patent is extended or adjusted under 35 U.S.C. 154(b) by 516 days.

(21) Appl. No.: 11/715,824

(22) Filed: Mar. 8, 2007

(65) Prior Publication Data

US 2008/0217732 A1  Sep. 11, 2008

(51) Int. Cl.
*H01L 29/93* (2006.01)
(52) U.S. Cl. .......... 257/528; 257/E51.04; 257/E23.165; 438/399
(58) Field of Classification Search ............. 257/528, 257/E51.04, E23.165; 438/399
See application file for complete search history.

(56) References Cited

U.S. PATENT DOCUMENTS

| | | | |
|---|---|---|---|
| 4,499,557 | A | 2/1985 | Holmberg et al. |
| 4,599,705 | A | 7/1986 | Holmberg et al. |
| 5,166,758 | A | 11/1992 | Ovshinsky et al. |
| 7,244,956 | B2 | 7/2007 | Pellizzer |
| 7,433,253 | B2 * | 10/2008 | Gogl et al. ............ 365/209 |
| 2006/0197130 | A1 | 9/2006 | Suh et al. |
| 2006/0216938 | A1 | 9/2006 | Miyagawa et al. |
| 2008/0002481 | A1 * | 1/2008 | Gogl et al. .......... 365/189.06 |
| 2008/0070162 | A1 * | 3/2008 | Ufert ................... 430/290 |
| 2009/0021976 | A1 * | 1/2009 | Liaw et al. ............ 365/148 |

FOREIGN PATENT DOCUMENTS

| | | |
|---|---|---|
| DE | 30 46 721 A1 | 10/1981 |
| DE | 10 2004 031 111 A1 | 1/2006 |
| DE | 10 2004 031 742 A1 | 1/2006 |
| EP | 1 469 532 A1 | 10/2004 |

OTHER PUBLICATIONS

Chang, L-W, et al., "Diblock Copolymer Directed Self-Assembly for CMOS Device Fabrication," Proceedings of SPIE, 2006, pp. 615611 pp. 1-6, vol. 6156, Design and Process Integration for Microelectronic Manufacturing IV, edited by Wong, et al.
Freer, E.M, et al., "Oriented Mesoporous Organosilicate Thin Films," Nano Lett., 2005, 1 page, vol. 5 (10), American Chemical Society.
Lee, S-M, et al., "Heat transport in thin dielectric films," J. Appl. Phys., Mar. 15, 1997, pp. 2590-2595, vol. 81 (6), American Institute of Physics.
Xu, D., et al., "Preparation of CdS Single-Crystal Nanowires by Electrochemically Induced Deposition," Advanced Materials, 2000, pp. 520-522, vol. 12, No. 7, Wiley-VCH, Weinheim, Germany.

* cited by examiner

*Primary Examiner*—Fernando L Toledo
(74) *Attorney, Agent, or Firm*—Slater & Matsil, L.L.P.

(57) ABSTRACT

An integrated circuit including a memory cell and methods of manufacturing the integrated circuit are described. The memory cell includes a resistive memory element including a top contact, a bottom contact, and a carbon storage layer disposed between the top contact and the bottom contact. The memory cell operates at a voltage in a range of approximately 0.5V to approximately 3V, and at a current in a range of approximately 1 μA to approximately 150 μA.

47 Claims, 10 Drawing Sheets

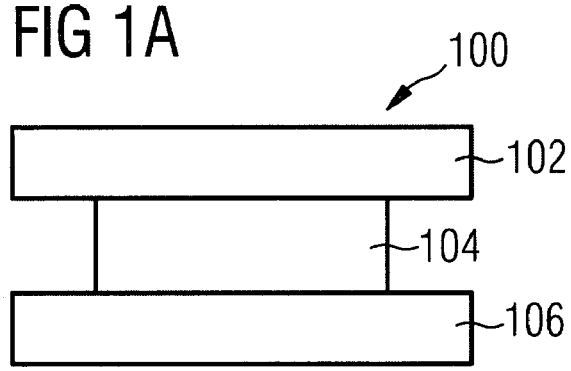
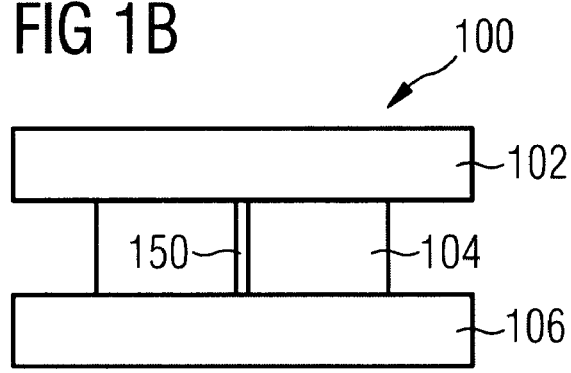
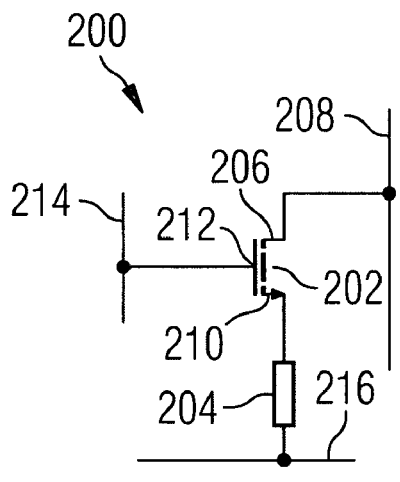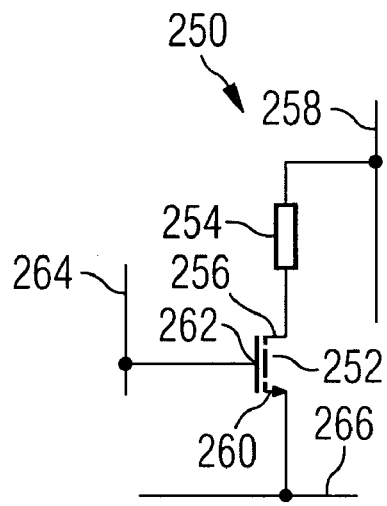

— 1 nm, 20 nm long
--- 2 nm, 20 nm long

CARBON MEMORY

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A and 1B show a carbon memory element;

FIGS. 2A and 2B show schematic representations of a memory cell that uses a carbon memory element;

DETAILED DESCRIPTION OF ILLUSTRATIVE EMBODIMENTS

Figure 3:
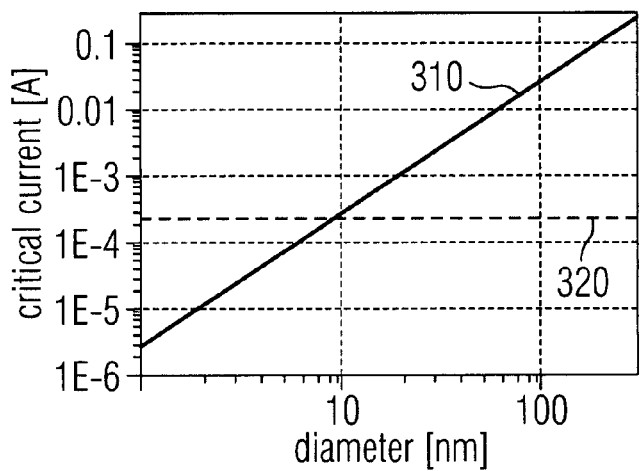
FIG. 3 shows a graph of a critical current against a diameter (in nm) of a carbon storage layer.

Memory devices are used in essentially all computing applications and in many electronic devices. For some applications, non-volatile memory, which retains its stored data even when power is not present, may be used. For example, non-volatile memory is typically used in digital cameras, portable audio players, wireless communication devices, personal digital assistants, and peripheral devices, as well as for storing firmware in computers and other devices.

A wide variety of memory technologies have been developed. Non-volatile memory technologies include flash memory, magnetoresistive random access memory (MRAM), phase change random access memory (PCRAM), and conductive bridging random access memory (CBRAM). Due to the great demand for memory devices, researchers are continually improving memory technology, and developing new types of memory, including new types of non-volatile memory.

The scale of electronic devices is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information. One such technology is a resistive memory, that stores information based on the resistance of a storage layer. Depending on the resistive memory technology being used, the resistance of the storage layer is typically switched between a low resistance state and a high resistance state through the application of voltage or current across the storage layer.

In accordance with an embodiment of the invention, carbon can be used to form the storage layer for such a resistive memory device. One way in which carbon can be used in such a resistive memory uses a temperature-induced phase change in an amorphous carbon film, in which application of a first temperature, $T_1$, causes the conversion of high resistivity sp$^3$-rich amorphous carbon to relatively low resistivity sp$^2$-rich amorphous carbon. This conversion can be reversed by application of a second temperature, $T_2$, which is generally higher than the temperature $T_1$. The temperatures T1 and T2 may be provided, for example, by driving a high enough current through the carbon. This phase change can be used to store information. For example, the high resistance sp$^3$-rich phase can be used to represent a "0", and the low resistance sp$^2$-rich phase can be used to represent a "1".

Another way in which the resistivity of an amorphous carbon film can be used to store information is by field-strength induced growth of a conductive path in an insulating amorphous carbon film. For example, applying voltage or current pulses may cause the formation of a conductive sp$^2$ filament in insulating sp$^3$-rich amorphous carbon. The operation of this type of resistive carbon memory is illustrated in FIGS. 1A and 1B.

FIG. 1A shows a memory element 100 that includes a top contact 102, a carbon storage layer 104 including an insulating amorphous carbon material rich in sp$^3$ hybridized carbon atoms, and a bottom contact 106. As shown in FIG. 1B, by forcing a current (or voltage) through the carbon storage layer 104, an sp$^2$ filament 150 can be formed in the sp$^3$-rich carbon storage layer 104, changing the conductivity (and resistance) of the memory element. Application of a current (or voltage) pulse with higher energy destroys the sp$^2$ filament 150, increasing the resistance of the carbon storage layer 104. As discussed above, the change in the resistance of the carbon storage layer 104 can be used to store information, with, for example, the high resistance state representing a "0" and the low resistance state representing a "1".

FIG. 2A shows a schematic representation of a memory cell that uses a resistive memory element, such as a resistive carbon memory element, as described above. The memory cell 200 includes a select transistor 202 and a resistive memory element 204. The select transistor 202 includes a source 206 that is connected to a bit line 208, a drain 210 that is connected to the memory element 204, and a gate 212 that is connected to a word line 214. The resistive memory element 204 is also connected to a common line 216, which may be connected to ground, or to other circuitry, such as circuitry (not shown) for determining the resistance of the memory cell 200, for use in reading. Alternatively, in some configurations, circuitry (not shown) for determining the state of the memory cell 200 during reading may be connected to the bit line 208. It should be noted that as used herein the terms connected and coupled are intended to include both direct and indirect connection and coupling, respectively.

To write to the memory cell, the word line 214 is used to select the cell 200, and a current (or voltage) on the bit line 208 is applied through the resistive memory element 204, to form or remove a conductive path or filament in the resistive memory element 204, changing the resistance of the resistive memory element 204. Similarly, when reading the cell 200, the word line 214 is used to select the cell 200, and the bit line 208 is used to apply a reading voltage across the resistive memory element 204 to measure the resistance of the resistive memory element 204.

The memory cell 200 may be referred to as a 1T1J cell, because it uses one transistor, and one memory junction (the resistive memory element 204). Typically, a memory device will include an array of many such cells. It will be understood that other configurations for a 1T1J memory cell, or configurations other than a 1T1J configuration may be used with a resistive memory element. For example, in FIG. 2B, an alternative arrangement for a 1T1J memory cell 250 is shown, in which a select transistor 252 and a resistive memory element 254 have been repositioned with respect to the configuration shown in FIG. 2A.

In the alternative configuration shown in FIG. 2B, the resistive memory element 254 is connected to a bit line 258, and to a source 256 of the select transistor 252. A drain 260 of the select transistor 252 is connected to a common line 266, which may be connected to ground, or to other circuitry (not shown), as discussed above. A gate 262 of the select transistor 252 is controlled by a word line 264.

A carbon memory element that includes highly conductive carbon (typically having a resistivity of approximately 1 mΩ-cm) in its storage layer may use current densities in the range of $10^7$ to $10^{10}$ A/cm$^2$ in order to change its state. This high current density may cause difficulty for scaling a memory array that uses such memory elements, due to limitations on the amount of current that can be delivered through a transistor. Additionally, due to the high total resistance of such a memory cell, the supply voltage may become very high in order to drive the high switching current. This may have a negative impact on the power consumption of the memory device. For carbon memory elements that use an insulating carbon material, a field strength in the range of 0.2V/nm may be used to form a conductive path in the insulating carbon storage layer.

In accordance with an embodiment of the invention, a commercially practical non-volatile carbon memory cell for use in a high density memory array may be operated at voltages in the range of approximately 0.5 to 3 V, and currents in the range of approximately 1 to 150 μA, or at approximately 100 μA. Meeting these operational constraints with a storage layer including a material that uses relatively high field strengths for switching can provide numerous design and manufacturing challenges.

The approximate average current density at which a highly conductive carbon layer breaks through is 350 MA/cm$^2$. The precise current density at which the carbon is modified can vary and depends on the deposition method of the carbon layer and the surrounding materials. The value of 350 MA/cm$^2$ is experimentally determined for a particular sample setup, but serves as an example reference point in this discussion. However, based on this current density, in accordance with an embodiment of the invention, the current strength and diameter of a carbon storage layer can be determined. FIG. 3 shows this, by providing a graph of the critical current against the diameter (in nm) of a storage layer. The line 310 represents a current density of 350 MA/cm$^2$, and the line 320 represents a current strength that can be handled by known transistor technologies, such as FinFETs, of approximately 130 μA at 1.3 V. The current strength should be at this level or lower in order to use such transistor technologies in a memory device. As can be seen, for a current strength appropriate for current technologies, such as FinFETs, at a current density of 350 MA/cm$^2$, the diameter of the carbon storage layer should be below 10 nm. Accordingly, some embodiments of the invention use a carbon storage layer with a diameter in the range of approximately 1 nm to approximately 9 nm.

A current density of 350 MA/cm$^2$ represents too high a load for conventional metallization. To handle this current density, the contacts that connect to the carbon storage layer may have cross-sectional areas that are larger than a cross-sectional area of the carbon storage layer. In addition, this constriction of the carbon storage layer also reduces the voltage drop on the wiring.

In some embodiments, the area of a cross-section of a connection or contact to the carbon storage layer is larger than the area of a cross-section of the carbon storage layer by a factor of approximately 10 to approximately 400, while in some embodiments the cross-sectional area of the contact is approximately 350 times as large as the cross-sectional area of the carbon storage layer. It should be noted that in memory elements that use an insulating carbon material in the carbon storage layer, this constriction in the carbon storage layer favors the formation of a single filament through the carbon storage layer. In this case, the current compression occurs naturally in the filament. Although the overall current may be very small, on the order of 10 μA, the respective current density may be on the order of $10^{10}$ A/cm$^2$, because the current is concentrated in the filament which may have extensions on the length scale of the carbon-carbon bonds.

Figure 4:
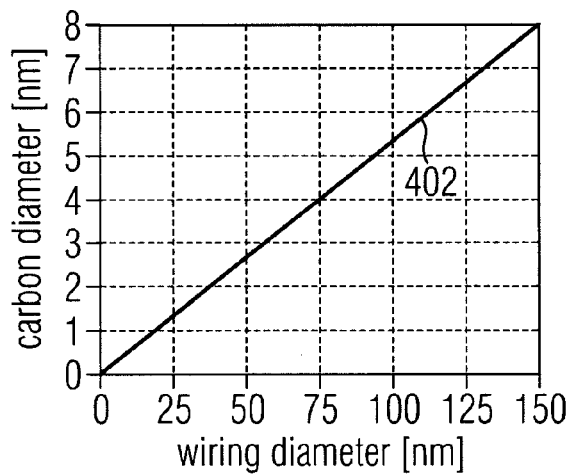
FIG. 4 shows a graph of the diameter of a carbon storage layer, depending on wiring or contact diameters, at a compression ratio of 350.

FIG. 4 shows a graph in which the line 402 represents the diameter of the carbon storage layer, depending on the wiring or contact diameters, at a compression ratio (i.e., the ratio of the cross-sectional area of the contact to the cross-sectional area of a constriction in the carbon storage layer) of 350. As can be seen, for a carbon storage layer with a diameter of 4 nm, the wiring or contacts to the carbon storage layer should have a diameter of approximately 75 nm.

It will be understood that these values serve only as guidance, or examples, and may vary according to specification of the reliability of the memory circuit. For example, the critical current densities in metal wiring are approximately 1-10 MA/cm$^2$ and are specified for a minimum life span of 10 years. If the current compression ratio is reduced so that the current density in the wiring is increased to values of 10-50 MA/cm$^2$ or higher, the life span of the device may be severely reduced. However, even with these higher current densities, the memory device may be able to operate for approximately $10^{15}$ cycles, since the high current densities are applied only for roughly 20 ns. A calculation of the real operating time at $10^{15}$ cycles yields an overall operating time of approximately 231 days. The same argument holds also for the current densities of the corresponding devices.

Figure 5:
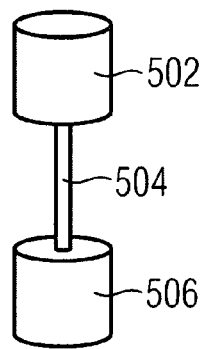
FIG. 5 shows a carbon memory element in accordance with an embodiment of the invention.

An example of a carbon memory element having a configuration in which the carbon storage layer includes a narrow constriction is shown in FIG. 5. The carbon memory element 500 includes a top contact 502, a carbon storage layer 504, and a bottom contact 506. The top contact 502 and bottom contact 506 have a larger cross-sectional diameter than the carbon storage layer 504, in order to handle the current density used for programming the carbon storage layer 504. If the carbon layer 504 uses an insulating carbon material through which a conductive path or filament is formed, the narrow constriction of the carbon storage layer 504 may encourage the formation of a single conductive path or filament, rather than multiple such filaments.

Having determined an appropriate diameter for the carbon storage layer and for the contacts of the storage layer, the length or layer thickness of the carbon storage layer may be determined. Generally, the resistance of the carbon storage layer is proportional to the layer thickness. In some embodiments, the resistance may be configured such that a relatively low voltage is sufficient to force a current having a current density of approximately 350 A/cm$^2$ through the carbon storage layer.

Figure 6:
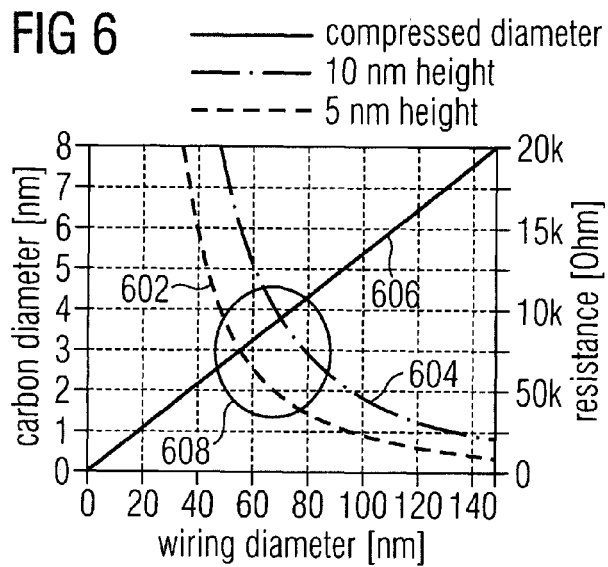
FIG. 6 shows a graph of the resistance of a carbon storage layer, depending on the thickness of the carbon storage layer for various diameters, at a compression ratio of 350.

FIG. 6 shows a graph of the dependence of the resistance on the storage layer thickness for various diameters, at the example compression ratio of approximately 350. The curve 602 represents a carbon storage layer having a height or thickness of 5 nm, while the curve 604 represents a carbon storage layer having a height or thickness of 10 nm. As in FIG. 4, above, the line 606 shows the diameter of the carbon storage layer depending on the diameter of the contacts at a compression ratio of 350.

For operation at approximately 2 V at approximately 100 µA, with a transistor having a resistance of approximately 8 kΩ, the carbon storage layer may have a resistance of approximately 10 to 12 kΩ or less. The circle 608 shows the area where the resistance is roughly in the range of about 3 kΩ to about 12 kΩ, which would provide for approximately 2V/100 µA operation of the memory cell.

Based on the parameters discussed above, for approximately 2V/100 µA operation, a memory cell in accordance with an embodiment of the invention may have a conductive carbon storage layer that is approximately 1 to approximately 5 nm thick, with a cross-sectional diameter of approximately 2 to approximately 4 nm, with contacts having a cross-sectional diameter selected so that the area of the contacts is approximately 350 times as large as the area of the carbon storage layer. Manufacturing a memory cell having these dimensions can be achieved using the methods discussed hereinbelow.

Figure 7:
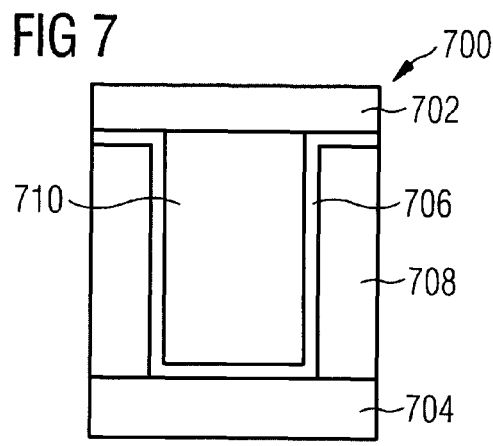
FIG. 7 shows a carbon memory element having a carbon storage layer configured as a cladding layer in a via, in accordance with an embodiment of the invention.

In accordance with another embodiment of the invention, the carbon storage layer may be configured as a cladding layer in a via, or by means of a "plug". This may achieve a relatively small cross section and reduced area for a memory cell that uses this approach. FIG. 7 shows an embodiment of a memory cell constructed according to this approach. The memory cell 700 includes a top contact 702 and a bottom contact 704. A carbon storage layer 706 is disposed between the top contact 702 and the bottom contact 704. The carbon storage layer 706 is formed as a cladding on an inner surface of a roughly cylindrical (or, in some embodiments, conical) via hole in an insulating material 708. A plug 710, which may include the same insulating material, fills in the via hole.

Figure 8:
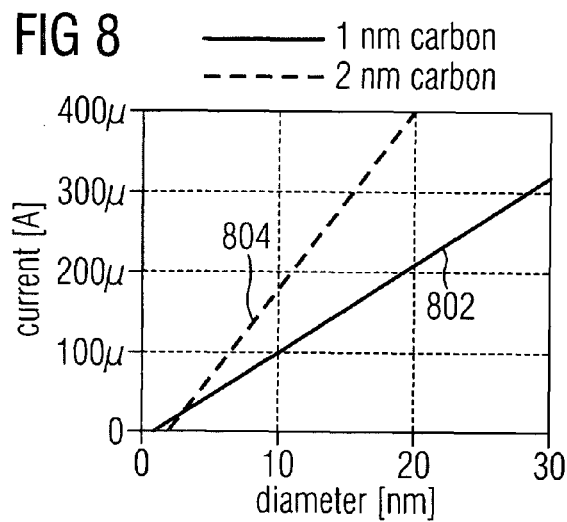
FIG. 8 shows a graph of the current for achieving a current density of 350 A/cm$^2$, against the diameter of the thickness of the carbon cladding layer.

To determine appropriate dimensions for a carbon memory cell having a configuration such as is shown in FIG. 7, similar example current densities and other conditions to those described hereinabove may be analyzed. FIG. 8 shows a graph of the current for achieving a current density of approximately 350 MA/cm$^2$, against the diameter of the via or plug and thickness of the carbon cladding. The line 802 represents a carbon storage layer configured as a cladding with a thickness of 1 nm. The line 804 represents a carbon cladding storage layer with a thickness of 2 nm. As can be seen, to keep the current around 100 µA, the via or plug should have a diameter less than approximately 10 nm if the thickness of the carbon storage layer is 1 nm, or less than approximately 7 nm if the thickness of the carbon storage layer is 2 nm.

Figure 9:
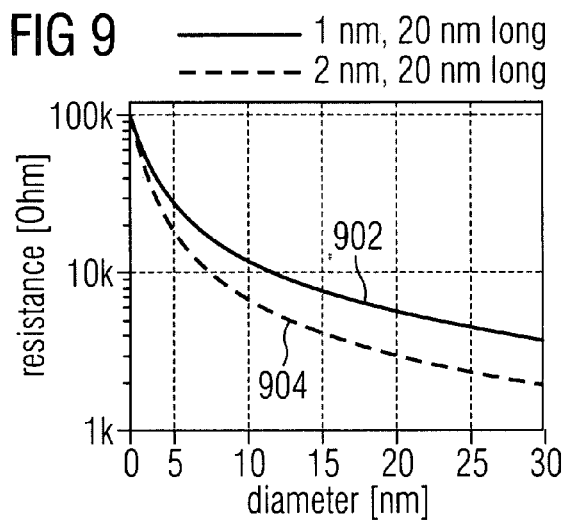
FIG. 9 shows a graph of the resistance of the carbon storage layer, depending on the diameter of the via.

In FIG. 9, a graph of the resistance of the carbon storage layer depending on the diameter of the via or plug is shown. The curve 902 represents a 1 nm thick carbon storage layer, and a via or plug that is approximately 20 nm deep. The curve 904 represents a 2 nm thick carbon storage layer under similar conditions. To provide for operation at approximately 2V/100 µA, and assuming that the transistor in the memory cell adds approximately 8 kΩ of resistance, the resistance of the carbon storage layer should be approximately 10 to 12 kΩ or less. As can be seen in the graph shown in FIG. 9, for a 1 nm thick carbon storage layer, the diameter of the via or plug may be approximately 8 nm to achieve this resistance. Alternatively, the depth of the via or plug may be adjusted in length at smaller dimensions to achieve a resistance of 10 to 12 kΩ. For a 2 nm thick carbon storage layer, the diameter of the via or plug may be approximately 5 nm.

Thus, in accordance with an embodiment of the invention, for operation at approximately 2V/100 µA, the conductive carbon cladding storage layer may be about 1 (or as much as 2) nm thick, deposited in a via having a diameter of approximately 8 to 10 nm, and a depth of approximately 20 nm (though in some embodiments, a depth of approximately 30 nm may be used). A manufacturing process that provides a suitable template for a via having a diameter (width) in the rang of approximately 7 to 10 nm is described hereinbelow.

Figure 10A:
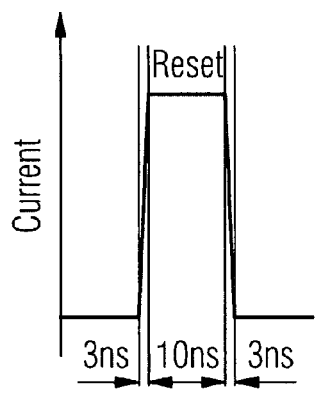
FIGS. 10A and 10B show current pulse shapes for resetting and setting a carbon memory in accordance with an embodiment of the invention.
Figure 10B:
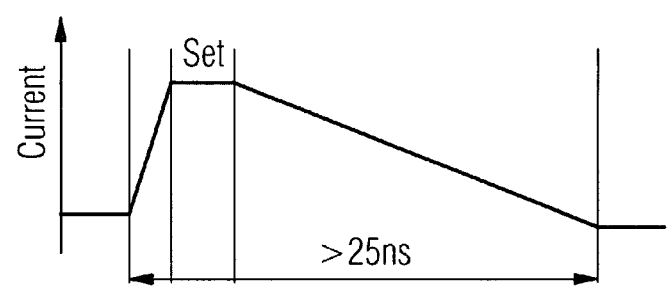

In some embodiments, a rewritable memory based on carbon may use a current pulse having a falling flank of approximately 10 ns or shorter for switching from a highly conductive state into a low conductivity state. This pulse shape is used to quench the state of the memory element relatively quickly, facilitating the formation of an sp$^3$-rich disordered state, with low conductivity. Use of such a pulse shape may help prevent afterglow in the carbon storage layer. FIG. 10A shows a reset current pulse for use in accordance with an embodiment of the invention. To achieve well separated resistance distributions for the low- and high-resistance states, a sharp turn-off of the reset pulse may be used. In some embodiments, this may be facilitated by use of an extra transistor to pull down the bit-line after a pulse in order to discharge the stored energy CV$^2$ of the circuit over this extra transistor and not over the carbon memory element. FIG. 10B shows a set pulse, which may have a longer falling flank.

Figure 11A:
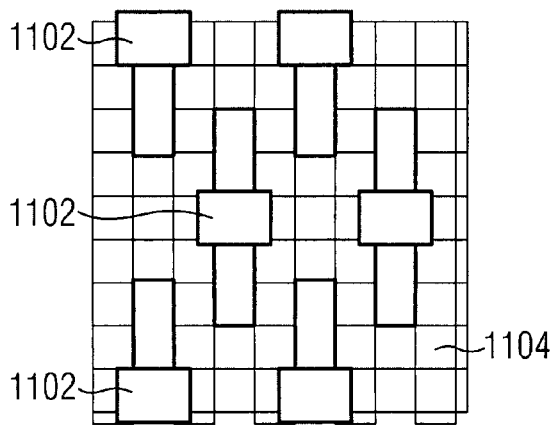
FIGS. 11A-11K show steps in a method for manufacturing a carbon memory in accordance with an embodiment of the invention.

Referring now to FIGS. 11A-11K, a method of manufacturing a carbon memory cell in accordance with an embodiment of the invention is described. FIG. 11A shows the layout of active areas 1102 on a substrate 1104 for formation of the transistors of memory cells in accordance with an embodiment of the invention. Conventional lithographic techniques and etching may be used to pattern the active areas 1102 on the substrate 1104, and form shallow trench isolation (STI) trenches. The STI trenches may then be filled and planarized.

Figure 11B:
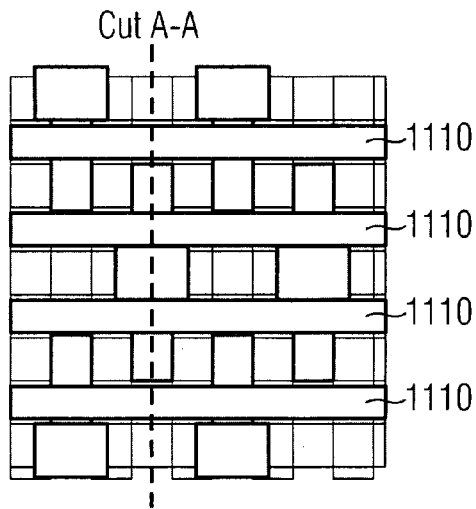

FIG. 11B shows a pattern for gate contacts 1110. Following the patterning of the active areas and well formation, a gate oxide layer is applied, and gate contacts 1110 are deposited and patterned. The gate contacts 1110 may include a conductive poly-silicon layer topped by a layer including a metal such as tungsten (W) or WSi, which serves as a word line. Next, caps and spacers are formed over the gate contacts 1110, typically through deposition and etching. It will be understood that there may be other conventional steps taken during the formation of the transistors, such as application and (later) removal of pad oxide and nitride layers that are used in the process of patterning, deposition and removal of mask layers involved in etching, and so on. Such intermediate steps and procedures will generally be known and understood by those of ordinary skill in the art. It will further be understood that other devices, such as FinFETs, Trigates, vertical devices, nanotubes and nanowires may be used in this memory structure, in accordance with alternative embodiments of the invention.

Figure 11C:
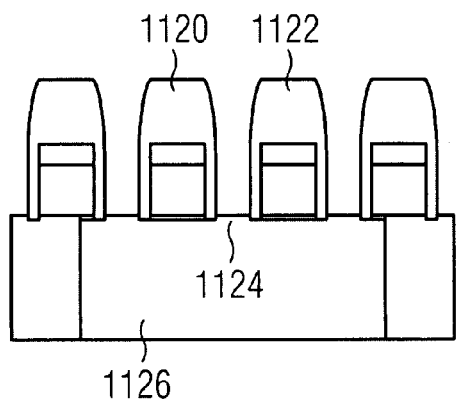

FIG. 11C shows a vertical view of the structure following formation of the transistors, along the line marked "Cut A-A" in FIG. 11B. This view shows transistor gate structures 1120 and 1122 for two memory cells, having a shared source/drain area 1124 in an active area 1126.

Figure 11D:
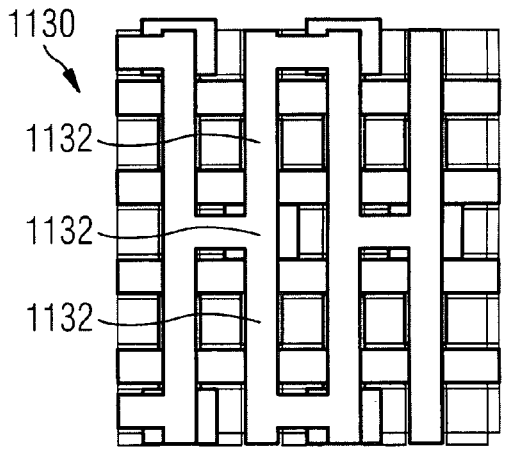
Figure 11E:
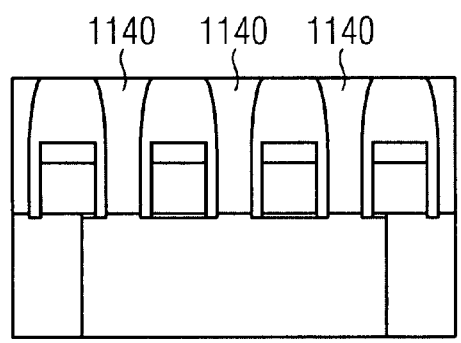

FIG. 11D shows a contact area lithography mask 1130, including areas 1132 of the integrated circuit where self-aligned contact holes may be etched. Following formation of the transistor gates, as described above, a middle-of-line (MOL) liner is deposited. The MOL liner may, for example, include a silicon nitride material, though other materials may also be used. Additionally, conventional techniques may be used for depositing interlayer dielectric (ILD) oxide and planarizing the ILD down to the level of the gate structures. Next, the contact areas are formed through conventional lithography and etching techniques, using a mask such as is shown in FIG. 11D. As shown in FIG. 11E, next, a carbon material 1140 is deposited and (optionally) etched to fill the contact holes. The carbon material may form a storage layer of a memory cell, as described above. As described below, in some embodiments, narrow carbon structures may be formed for use as a storage layer.

Figure 11F:
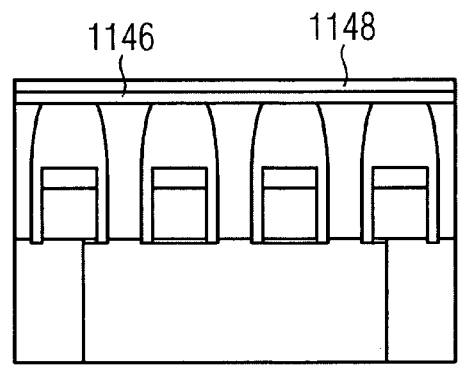

As shown in FIG. 11F, next, a layer 1146 of conductive material, such as Ti, is deposited, to form top contacts for the carbon memory structures. An oxide layer 1148 is deposited above the Ti layer 1146.

Figure 11G:
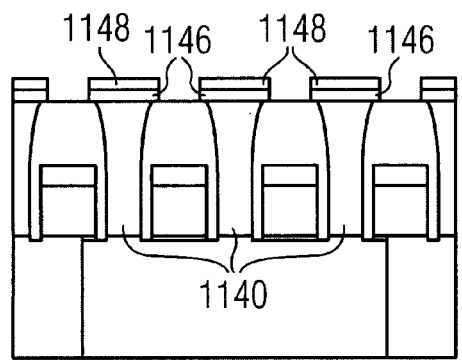

The oxide layer 1148 is used to structure the Ti layer 1146, using, for example, conventional masking, lithography, and etching techniques. Example results of this structuring are shown in FIG. 11G, in which The Ti layer 1146 and oxide layer 1148 have been structured so that the Ti layer 1146 forms contacts above the carbon material 1140.

Figure 11H:
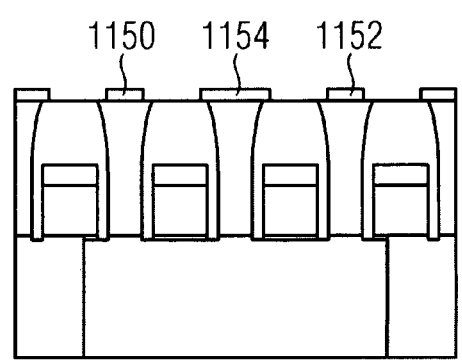

Next, as shown in FIG. 11H, a further portion of the Ti layer 1146 is removed to form contacts 1150 and 1152 over carbon areas where carbon memory elements as described above may be formed, and a contact 1154 over a shared source/drain contact. This may be achieved, as shown in the figure, by reducing the area covered by the oxide layer 1148, for example using diluted HF, and then using this as a mask for reducing the area covered by the Ti layer 1146. Alternatively, the oxide layer 1148 may be completely removed prior to trimming the covered areas covered by the Ti layer 1146. As can be seen in FIG. 11H the contacts 1150 and 1152 may be smaller than the carbon areas over which they are formed.

Figure 11I:
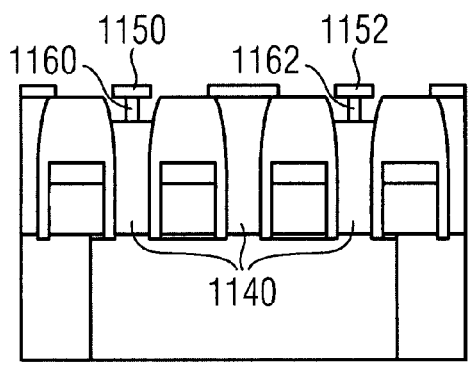

Next, as shown in FIG. 11I, narrow carbon structures 1160 and 1162 for use in carbon memory elements, such as those described above, are formed. This may be achieved in this embodiment by an underetch process, in which the carbon material 1140 under the contacts 1150 and 1152 is etched to form the narrow carbon structures 1160 and 1162. This etching may be carried out using, for example, a hydrogen plasma, an oxygen plasma, a CO plasma, or using other conventional etching techniques. A bottom contact for the memory elements formed using the narrow carbon structures 1160 and 1162 may include a conductive carbon material beneath the narrow carbon structures 1160 and 1162. Alternatively, another conductive material for use as a bottom contact could have been deposited in the contact holes beneath the areas in which the narrow carbon structures 1160 and 1162 were formed.

Figure 11J:
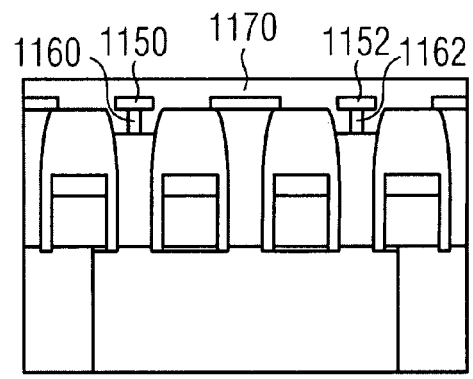
Figure 11K:
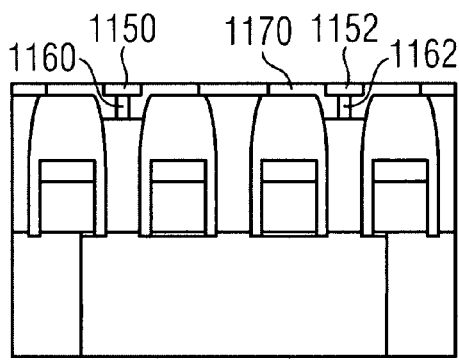

Next, an oxide layer 1170 may be deposited to fill the areas around the carbon structures 1160 and 1162, as shown in FIG. 11J. The oxide layer 1170 may then be planarized down to the level of the Ti contacts 1150 and 1152, as shown in FIG. 11K. This may be achieved using conventional chemical-mechanical planarization (CMP) techniques, though other planarization techniques may also be used.

After the formation of the carbon structures 1160 and 1162, for use as carbon memory elements, as described above, manufacture of the integrated circuit, including depositing of metal layers for bit lines, and formation of other structures on the integrated circuit may continue using conventional techniques.

Figure 12A:
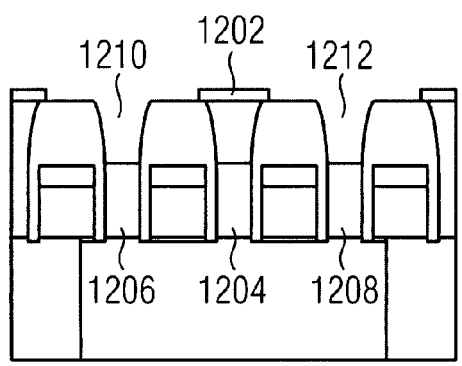
FIGS. 12A-12C show steps in an alternative method for manufacturing a carbon memory in accordance with an embodiment of the invention.
Figure 12B:
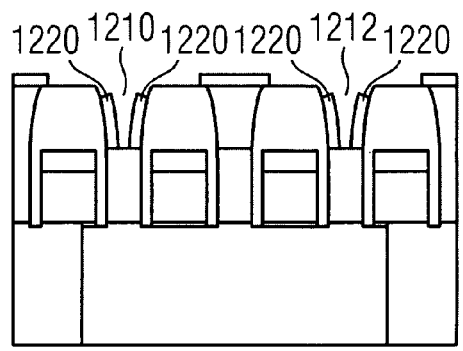
Figure 12C:
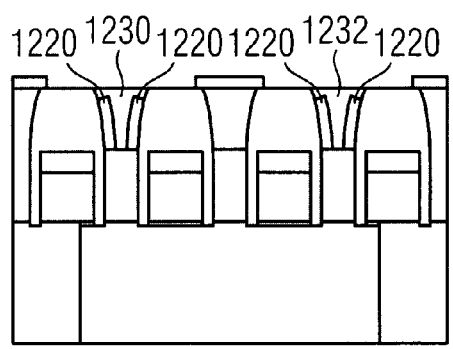

FIGS. 12A-12C show another embodiment of a method for forming narrow carbon structures for use in a carbon memory element, as described above. In this embodiment, spacers within the contact areas between gates are used to form narrow carbon structures.

FIG. 12A shows an integrated circuit similar to that described above in FIGS. 11A-11K, after forming contacts of Ti or another conductive material, as discussed with reference to FIG. 11H. In the embodiment shown in FIG. 12A, a shared source/drain contact 1202, which may include Ti, remains over a carbon-filled shared source/drain contact hole 1204. In contact holes 1206 and 1208, in which carbon memory elements are to be formed, the carbon material filling the holes has been removed, for example by etching, to form recesses 1210 and 1212. It will be understood that other conducting material can be used to fill the source/drain contacts 1204, 1206 and 1208, and can be processed in a similar manner.

Next, as shown in FIG. 12B, a spacer material, such as SiO or SiN is deposited and back-etched to form spacers 1220 within the recesses 1210 and 1212. Additional carbon is then deposited and back-etched to fill the areas between the spacers 1220, forming narrow carbon structures 1230 and 1232, as shown in FIG. 12C. The narrow carbon structures 1230 and 1232 may be used in carbon memory elements, as described above.

Figure 13A:
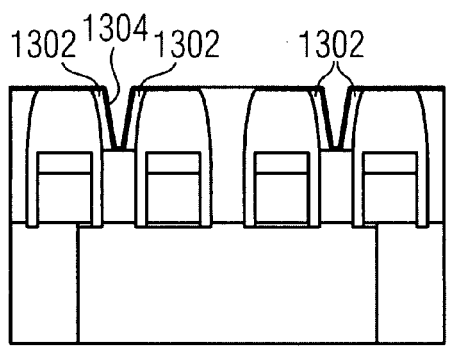
FIGS. 13A-13D show steps in a method for manufacturing a carbon memory having a carbon storage layer configured as a cladding layer in a via, in accordance with an embodiment of the invention.

FIGS. 13A-13D show an embodiment of a method for forming a carbon memory element using a carbon storage layer configured as a cladding layer, as described above with reference to FIG. 7. As shown in FIG. 13A, after the formation of spacers 1302, by methods similar to those described above with reference to FIGS. 12A and 12B, a thin carbon layer 1304 may be deposited. In some embodiments, the carbon layer 1302 may have a thickness of approximately 1 nm to approximately 2 nm.

Figure 13B:
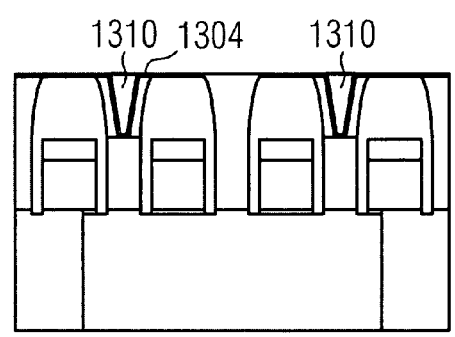
Figure 13C:
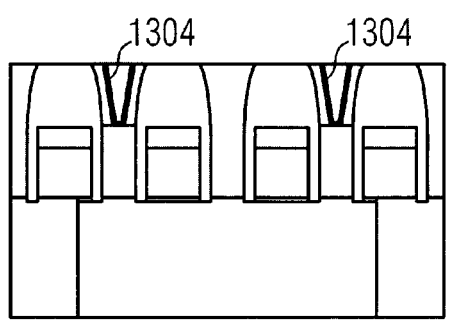

Next, as shown in FIG. 13B, a plug 1310 is formed by depositing a nitride or oxide material, and planarizing (e.g., using CMP) the material with a stop on the carbon layer 1304. Excess carbon from the carbon layer 1304 is then removed, as shown in FIG. 13C. This may be achieved, for example, by etching using a hydrogen or oxygen plasma.

Figure 13D:
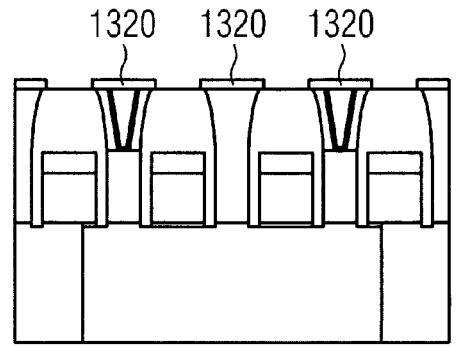

Next, as shown in FIG. 13D, the nitride or oxide of the spacers 1302 and plug 1310 may be recessed lightly, and conductive contacts 1320 may be formed. The conductive contacts 1320 may include a metal, such as Ti.

Figure 14A:
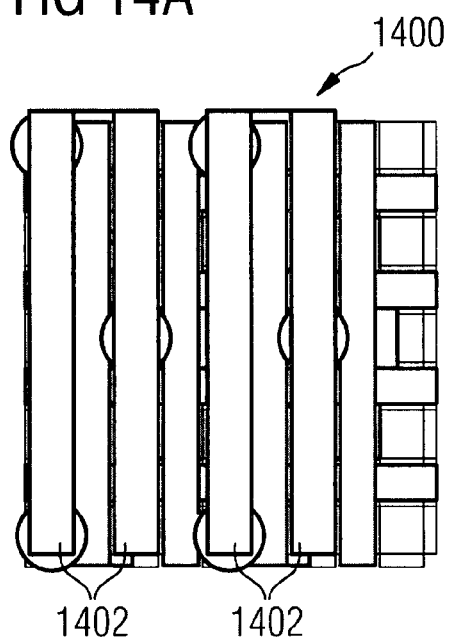
FIGS. 14A-14C illustrate further steps in a method for manufacturing a carbon memory in accordance with an embodiment of the invention.
Figure 14B:
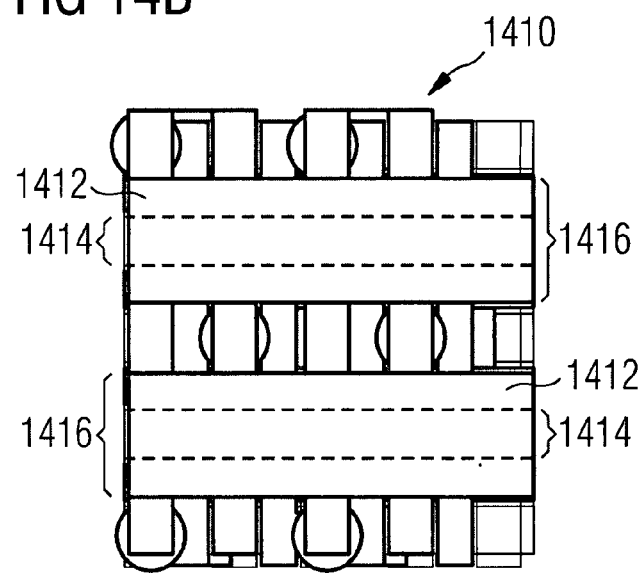
Figure 14C:
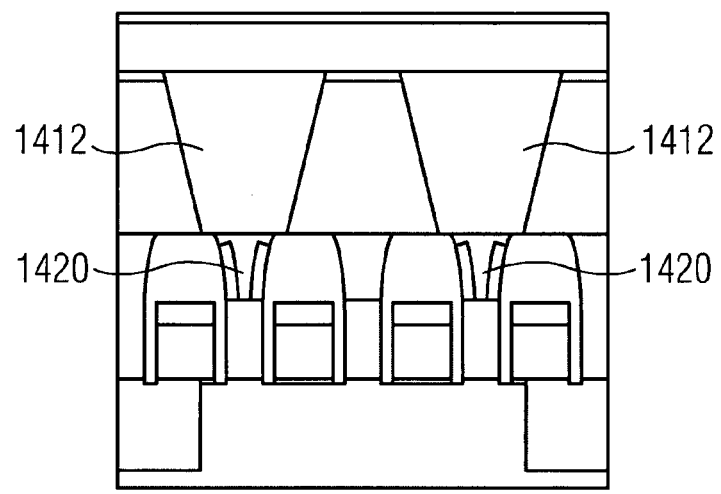

Following the formation of a carbon memory element, as described above, the subsequent patterning and metallization for forming bit lines and contacts may be performed. FIGS. 14A-14C illustrate one example of this process. FIG. 14A shows a pattern 1400 for forming bit lines 1402. In some embodiments, the bit lines have a width of approximately 0.7 F, with 1.3 F spaces between lines, where F is the design rule feature size. The bit lines may be formed of a conductive material, such as tungsten (W) or another metal.

FIG. 14B shows a pattern 1410 for formation of contacts 1412. As can be seen, bottoms 1414 of the contacts 1412 are narrower than tops 1416 of the contacts 1412. the contacts 1412 may be formed of a conductive material, such as W or another metal. FIG. 14C shows a view of the semiconductor in accordance with an embodiment of the invention, including two memory cells including carbon memory elements, as well as contacts 1412 and bit lines 1402.

Figure 15:
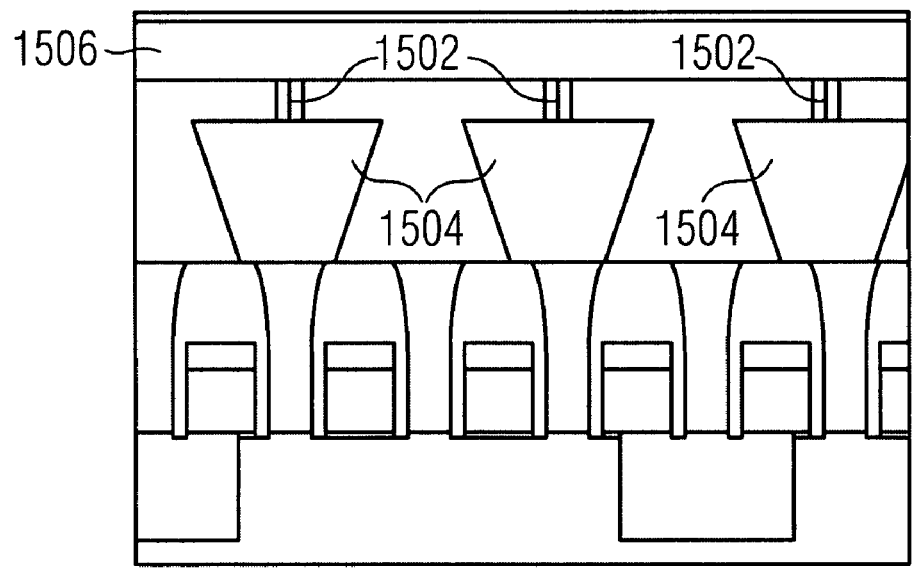
FIG. 15 shows a carbon memory in which the carbon memory elements are formed during a back-end-of-line (BEOL) process, in accordance with an embodiment of the invention.

As illustrated in FIG. 15, in an alternative embodiment, the carbon memory elements may be formed during a back-end-of-line (BEOL) process, above the transistor gate elements. As can be seen, carbon structures 1502, suitable for use in a carbon memory element, may be formed between contacts 1504 and a bit line 1506. Methods similar to those illustrated above in FIGS. 11-14 may be used to form such carbon structures 1502.

Figure 16:
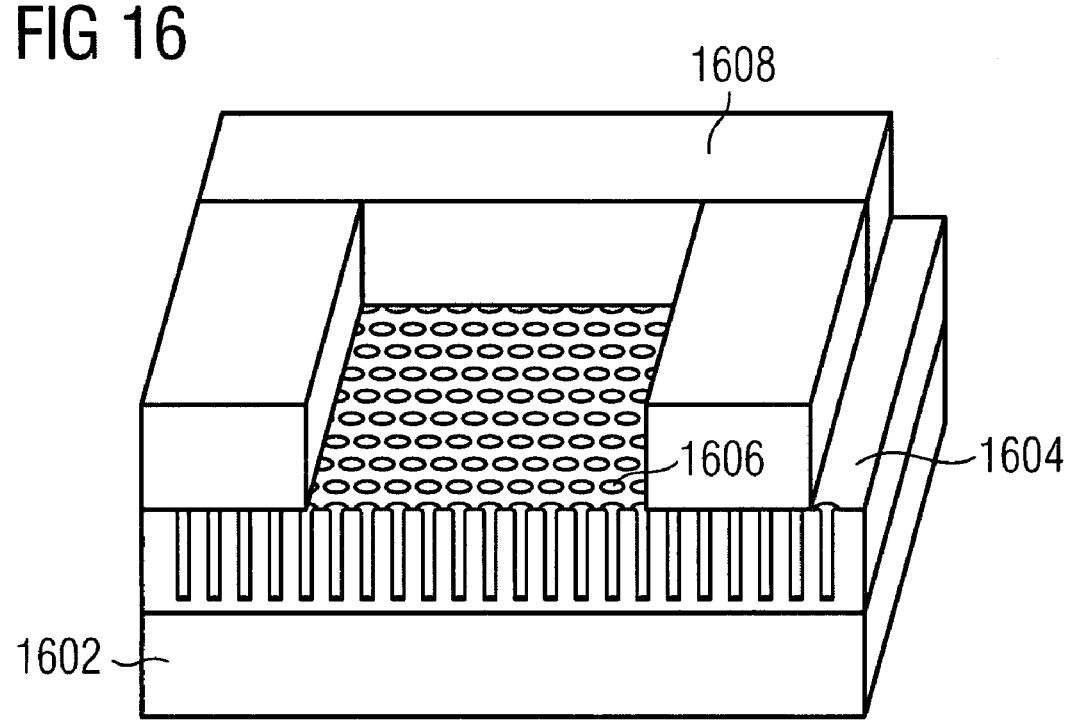
FIG. 16 shows another embodiment, in which carbon memory elements may be formed using a self-organizing structure including nanometer-sited pores, in accordance with an embodiment of the invention.

FIG. 16 shows another embodiment, in which the bottom portion of the device, where the transistors are formed, is left untouched, and self-organizing structures are used to provide nanometer-sized pores for use in a carbon memory. To achieve this, approximately 10 nm of Ti may be deposited on a substrate 1602 to be treated, and this is covered with a layer 1604 of high-purity aluminum having a thickness of approximately 2 nm to approximately 100 nm. This may be achieved, for example, by sputtering at a temperature of approximately 300° C. to approximately 400° C., followed by a temper process at a temperature of approximately 450° C. in $H_2$. The surface may then be smoothed, for example, using a chemical-mechanical polishing (CMP) or electrochemical polishing.

Narrow pores 1606 for use in creating a carbon memory element may then be formed in the surface through use of acids. For example, pore sizes of approximately 8 nm may be formed by potentiostatic anodization of the high-purity aluminum in an aqueous solution of approximately 14% $H_2SO_4$ at a temperature between approximately −20° C. and approximately +20° C. A pore size of approximately 20 nm or approximately 90 nm may be achieved in a similar way, using aqueous solutions of approximately 4% and 2% oxalic acid, respectively. The size of the pores 1606 may be further increased by etching or decreased by means of atomic layer deposition (ALD) or chemical vapor deposition (CVD) using spacer techniques.

Conventional lithography techniques may be used to structure the surface to cover regions of the surface with photo resist for further processing. For example, in some embodiments, regions which are to be treated are uncovered, and other regions are covered with a photoresist 1608. Alternatively, a complementary structure can be used, in which regions to be treated are covered with the photoresist 1608, and other regions are left uncovered. The desired regions can then be further processed, for example by mapping the structure by means of a dry etch process or by carrying out a deposition process.

Using these self-organizing methods, sublithographically small vias and templates may be manufactured for use in a carbon memory element, as described above.

Figure 17A:
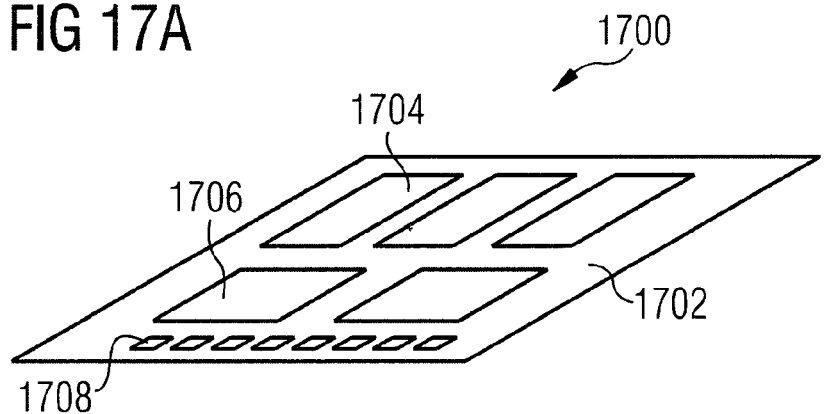
FIGS. 17A and 17B show a memory module and stackable memory module that may use a carbon memory, in accordance with an embodiment of the invention.
Figure 17B:
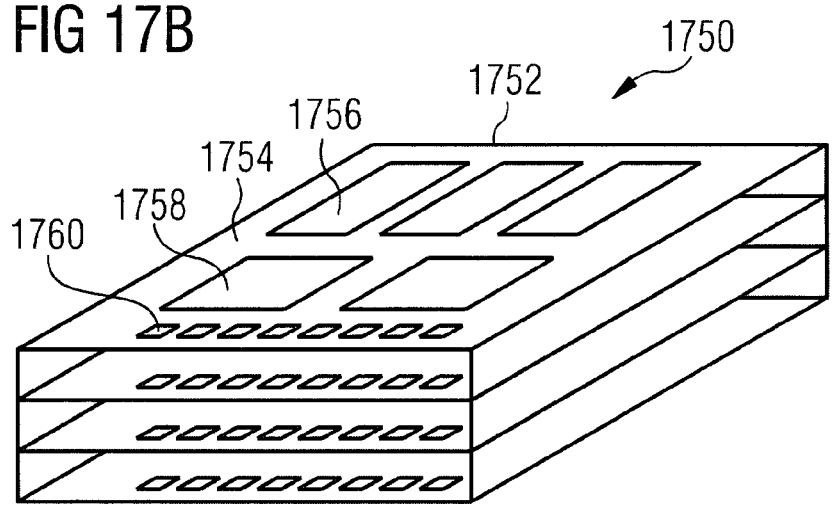

Memory cells using a carbon memory element in accordance with an embodiment of the invention may be used in memory devices that contain large numbers of such cells. These cells may, for example, be organized into an array of memory cells having numerous rows and columns of cells, each of which stores more than one bit of information. Memory devices of this sort may be used in a variety of applications or systems. As shown in FIGS. 17A and 17B, in some embodiments, memory devices such as those described herein may be used in modules. In FIG. 17A, a memory module 1700 is shown, on which one or more memory devices 1704 are arranged on a substrate 1702. Each memory device 1704 may include numerous memory cells in accordance with an embodiment of the invention. The memory module 1700 may also include one or more electronic devices 1706, which may include memory, processing circuitry, control circuitry, addressing circuitry, bus interconnection circuitry, or other circuitry or electronic devices that may be combined on a module with a memory device 1704. Additionally, the memory module 1700 includes multiple electrical connections 1708, which may be used to connect the memory module 1700 to other electronic components, including other modules.

As shown in FIG. 17B, in some embodiments, these modules may be stackable, to form a stack 1750. For example, a stackable memory module 1752 may contain one or more memory devices 1756, arranged on a stackable substrate 1754. Each of the memory devices 1756 contains memory cells that employ memory elements in accordance with an embodiment of the invention. The stackable memory module 1752 may also include one or more electronic devices 1758, which may include memory, processing circuitry, control circuitry, addressing circuitry, bus interconnection circuitry, or other circuitry or electronic devices that may be combined on a module with a memory device 1756. Electrical connections 1760 are used to connect the stackable memory module 1752 with other modules in the stack 1750, or with other electronic devices. Other modules in the stack 1750 may include additional stackable memory modules, similar to the stackable memory module 1752 described above, or other types of stackable modules, such as stackable processing modules, control modules, communication modules, or other modules containing electronic components.

Figure 18:
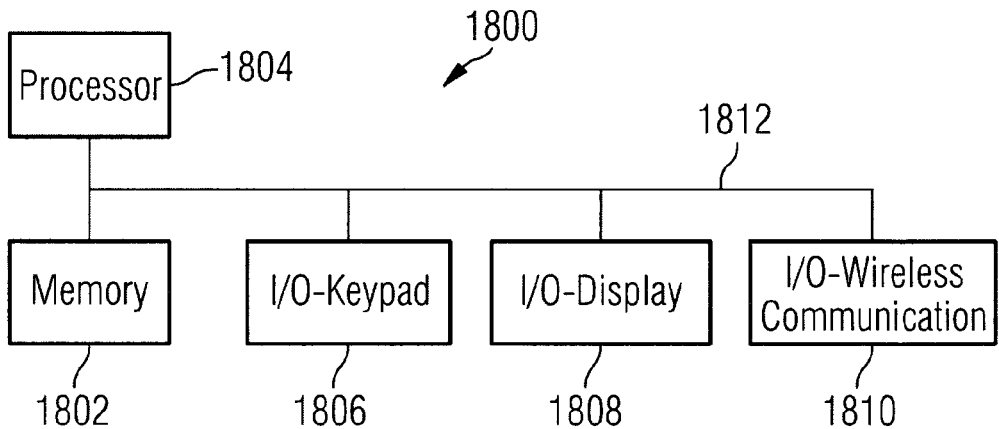
FIG. 18 shows a computing system that uses a carbon memory, in accordance with an embodiment of the invention.

In accordance with some embodiments of the invention, memory devices that include memory cells or memory elements as described herein may be used in a variety of applications or systems, such as the illustrative computing system shown in FIG. 18. The computing system 1800 includes a memory device 1802, which may include carbon memory cells as described hereinabove. The system also includes a processing apparatus 1804, such as a microprocessor or other processing device or controller, as well as input and output apparatus, such as a keypad 1806, display 1808, and/or wireless communication apparatus 1810. The memory device 1802, processing apparatus 1804, keypad 1806, display 1808 and wireless communication apparatus 1810 are interconnected by a bus 1812.

The wireless communication apparatus 1810 may have the ability to send and/or receive transmissions over a cellular telephone network, a WiFi wireless network, or other wireless communication network. It will be understood that the various input/output devices shown in FIG. 18 are merely examples. Memory devices including memory cells in accordance with embodiments of the invention may be used in a variety of systems. Alternative systems may include a variety of input and output devices, multiple processors or processing apparatus, alternative bus configurations, and many other configurations of a computing system. Such systems may be configured for general use, or for special purposes, such as cellular or wireless communication, photography, playing music or other digital media, or any other purpose now known or later conceived to which an electronic device or computing system including memory may be applied.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a memory cell comprising a resistive memory element that comprises a top contact, a bottom contact, and a carbon storage layer disposed between the top contact and the bottom contact, the memory cell operating at a voltage in a range of approximately 0.5 V to approximately 3 V, and at a current in a range of approximately 1 µA to approximately 150 µA for write or erase operation of a bit, wherein the carbon storage layer comprises a narrow constriction, with a cross-sectional area of the constriction being smaller than a cross-sectional area of the top contact or the bottom contact.

2. The integrated circuit of claim 1, wherein the memory cell is a non-volatile memory cell.

3. The integrated circuit of claim 1, wherein the cross-sectional area of the constriction of the carbon storage layer is smaller than the cross-sectional area of the top contact or the bottom contact by a factor of approximately 10 to approximately 400.

4. The integrated circuit of claim 1, wherein the cross-sectional area of the constriction of the carbon storage layer is smaller than the cross-sectional area of the top contact or of the bottom contact by a factor of approximately 350.

5. The integrated circuit of claim 1, wherein the carbon storage layer comprises a carbon cladding disposed on an inner surface of a via.

6. The integrated circuit of claim 5, wherein the carbon storage layer has a thickness in a range of approximately 1 nm to approximately 2 nm.

7. The integrated circuit of claim 5, wherein the via has a diameter of approximately 10 nm or less.

8. The integrated circuit of claim 7, wherein the via has a diameter in a range of approximately 1 nm to approximately 10 nm.

9. The integrated circuit of claim 5, wherein the via has a depth of approximately 30 nm or less.

10. The integrated circuit of claim 1, wherein the memory cell operates at a current of approximately 100 µA or less.

11. The integrated circuit of claim 1, wherein the carbon storage layer stores information by a phase change in the carbon storage layer.

12. The integrated circuit of claim 1, wherein the carbon storage layer stores information by formation of a conductive path in the carbon storage layer.

13. An integrated circuit comprising:
    a memory cell comprising a resistive memory element that comprises a top contact, a bottom contact, and a carbon storage layer disposed between the top contact and the bottom contact, the memory cell operating at a voltage in a range of approximately 0.5 V to approximately 3 V, and at a current in a range of approximately 1 µA to approximately 150 µA for write or erase operation of a bit, wherein the carbon storage layer comprises a narrow constriction, with a cross-sectional area of the constriction being smaller than a cross-sectional area of the top contact or the bottom contact, and wherein the narrow constriction of the carbon storage layer encourages the formation of only a single conductive path within the carbon storage layer.

14. An integrated circuit comprising:
    a memory cell comprising a resistive memory element that comprises a top contact, a bottom contact, and a carbon storage layer disposed between the top contact and the bottom contact, the memory cell operating at a voltage in a range of approximately 0.5 V to approximately 3 V, and at a current in a range of approximately 1 µA to approximately 150 µA for write or erase operation of a bit, wherein the carbon storage layer has a thickness in a range of approximately 1 nm to approximately 5 nm.

15. An integrated circuit comprising:
    a memory cell comprising a resistive memory element that comprises a top contact, a bottom contact, and a carbon storage layer disposed between the top contact and the bottom contact, the memory cell operating at a voltage in a range of approximately 0.5 V to approximately 3 V, and at a current in a range of approximately 1 µA to approximately 150 µA for write or erase operation of a bit, wherein the carbon storage layer has a diameter below approximately 10 nm.

16. The integrated circuit of claim 15, wherein the diameter of the carbon storage layer is in a range of approximately 1 nm to approximately 4 nm.

17. An integrated circuit comprising:
    a memory cell comprising a resistive memory element that comprises a top contact, a bottom contact, and a carbon storage layer disposed between the top contact and the bottom contact, the memory cell operating at a voltage in a range of approximately 0.5 V to approximately 3 V, and at a current in a range of approximately 1 µA to approximately 150 µA for write or erase operation of a bit, wherein the memory cell uses a current pulse having a falling flank of approximately 10 ns or shorter for switching from a high conductivity state into a low conductivity state.

18. An integrated circuit comprising:
    a memory cell comprising a select transistor and a carbon memory element electrically coupled to the select transistor, the carbon memory element comprising a top contact, a bottom contact, and a narrow carbon structure, the narrow carbon structure having a cross-sectional area that is smaller by a factor of approximately 10 to approximately 400 than a cross-sectional area of the top contact on a cross-sectional area of the bottom contact.

19. The integrated circuit of claim 18, wherein the narrow carbon structure has a diameter below approximately 10 nm.

20. The integrated circuit of claim 19, wherein the diameter of the narrow carbon structure is in a range of approximately 1 nm to approximately 4 nm.

21. The integrated circuit of claim 18, wherein the carbon memory element comprises a non-volatile memory element.

22. The integrated circuit of claim 18, wherein the memory cell operates at a voltage in a range of approximately 0.5V to approximately 3V, and at a current in a range of approximately 1 µA to approximately 150 µA.

23. The integrated circuit of claim 22, wherein the memory cell operates at a current of approximately 100 µA or less.

24. The integrated circuit of claim 18, wherein the memory cell uses a current pulse having a falling flank of approximately 10 ns or shorter for switching from a high conductivity state into a low conductivity state.

25. The integrated circuit of claim 18, wherein the narrow carbon structure stores information by a phase change.

26. The integrated circuit of claim 18, wherein the narrow carbon structure stores information by formation of a conductive path.

27. A memory module comprising:
a multiplicity of integrated circuits, wherein said integrated circuits comprise a memory cell comprising a resistive memory element that comprises a top contact, a bottom contact, and a carbon storage layer disposed between the top contact and the bottom contact, the memory cell operating at a voltage in a range of approximately 0.5V to approximately 3V, and at a current in a range of approximately 1 µA to approximately 150 µA, wherein the carbon storage layer has a thickness in a range of approximately 1 nm to approximately 5 nm.

28. The memory module of claim 27, wherein the memory cell is a non-volatile memory cell.

29. The memory module of claim 27, wherein the carbon storage layer comprises a narrow constriction, the constriction having a cross-sectional area that is smaller than a cross-sectional area of the top contact or a cross-sectional area of the bottom contact.

30. The memory module of claim 27, wherein the carbon storage layer has a diameter below approximately 10 nm.

31. The memory module of claim 27, wherein the carbon storage layer comprises a carbon cladding disposed on an inner surface of a via.

32. The memory module of claim 31, wherein the carbon cladding has a thickness in a range of approximately 1 nm to approximately 2 nm.

33. The memory module of claim 31, wherein the via has a diameter of approximately 10 nm or less.

34. The memory module of claim 27, wherein the memory cell uses a current pulse having a falling flank of approximately 10 ns or shorter for switching from a high conductivity state into a low conductivity state.

35. The memory module of claim 27, wherein the carbon storage layer stores information by a phase change in the carbon storage layer.

36. The memory module of claim 27, wherein the carbon storage layer stores information by formation of a conductive path in the carbon storage layer.

37. The memory module of claim 27, wherein the memory module is stackable.

38. A computing system comprising:
an input apparatus;
an output apparatus;
a processing apparatus; and
a memory, said memory comprising a memory cell comprising a resistive memory element that comprises a top contact, a bottom contact, and a carbon storage layer disposed between the top contact and the bottom contact, the memory cell operating at a voltage in a range of approximately 0.5V to approximately 3V, and at a current in a range of approximately 1 µA to approximately 150 µA, wherein the carbon storage layer has a thickness in a range of approximately 1 nm to approximately 5 nm.

39. The computing system of claim 38, wherein the memory cell is a non-volatile memory cell.

40. The computing system of claim 38, wherein the carbon storage layer comprises a narrow constriction, the constriction having a cross-sectional area that is smaller than a cross-sectional area of the top contact or a cross-sectional area of the bottom contact.

41. The computing system of claim 38, wherein the carbon storage layer has a diameter below approximately 10 nm.

42. The computing system of claim 38, wherein the carbon storage layer comprises a carbon cladding disposed on an inner surface of a via.

43. The computing system of claim 42, wherein the carbon cladding has a thickness in a range of approximately 1 nm to approximately 2 nm.

44. The computing system of claim 42, wherein the via has a diameter of approximately 10 nm or less.

45. The computing system of claim 38, wherein the memory cell uses a current pulse having a falling flank of approximately 10 ns or shorter for switching from a high conductivity state into a low conductivity state.

46. The computing system of claim 38, wherein the carbon storage layer stores information by a phase change in the carbon storage layer.

47. The computing system of claim 38, wherein the carbon storage layer stores information by formation of a conductive path in the carbon storage layer.

* * * * *